THIN FILM CRYOTRON DEVICE COMPOSED OF A PLURALITY OF SUPERIMPOSED PLANAR ELEMENTS

Filed Feb. 4, 1959

INVENTOR
JACOB FREDRIK KLINKHAMER
BY
Frank R. Trifari
AGENT 3,335,295
Patented Aug. 8, 1967

3,335,295

THIN FILM CRYOTRON DEVICE COMPOSED OF A PLURALITY OF SUPERIMPOSED PLANAR ELEMENTS

Jacob Fredrik Klinkhamer, Emmasingel, Eindhoven, Netherlands, assignor to North American Philips Company, Inc., New York, N.Y., a corporation of Delaware Filed Feb. 4, 1959, Ser. No. 791,227
Claims priority, application Netherlands, Mar. 31, 1958, 226,412
15 Claims. (Cl. 307—88.5)

This invention relates to a cryotron, comprising a gate conductor of superconducting material and a control conductor. The invention also relates to a cryotron arrangement built up from a number of such cryotrons.

In the "Proceedings of the Institute of Radio Engineers," April 1956, pages 482 et seq., such a cryotron is described, which in principle comprises a current conductor made of super-conductive material, the so-called gate conductor, which by control of the magnetic field of a current-carrying second current conductor, the so-called control conductor, which preferably is made of a superconducting material having a higher transition temperature than the gate conductor, can be caused at will to pass to a normal resistance state or a superconducting state at a suitably chosen low ambient temperature, for example, a few degrees Kelvin. Such a switching element can be used for a variety of switching functions, especially in memory circuits or logical circuits. For special applications there may be combined in one cryotron either a number of control conductors with one gate conductor or one control conductor with a number of gate conductors or a number of control conductors with a number of gate conductors.

In the cryotron described in the said publication the control conductor is a winding wound on the gate conductor. In order to increase the switching speed of a cryotron by increasing the ratio $R/L$, where R is the normal-conductivity resistance of the gate conductor and L the inductance of the control conductor, the gate conductor and the control conductor are mounted on a support as conductive strips in the form of thin layers, for example, as linear or strip-shaped electrodes deposited from vapour whilst retaining the abovementioned configuration. For this purpose there are provided on a support, in succession, a number of parallel arranged niobium strips, on top thereof a thin electrically insulating layer, on this layer a rectilinear tantalum strip which extends at right angles to the niobium strips and forms the gate conductor, another electrically insulating layer and finally another number of parallel arranged niobium strips which are at an angle to the above-mentioned niobium strips, the two sets of niobium strips being suitably interconnected so as to form the control conductor winding of the cryotron. Apart from the fact that the manufacture of such a cryotron is very laborious, such a structure has a limitation in that it does not lend itself to compact mounting of a number of cryotrons and of an associated network to form a cryotron system, since the assembly is difficult to survey and complicated owing to the large number of electrical connections between the various network elements across the layers. Furthermore this arrangement is not readily accessible to various techniques, such as deposition from vapour, etching, imprinting by chemical means, and the like.

It is an object of the present invention to provide a simple particularly suitable construction of a cryotron, which does not have the above-mentioned limitations or at least has them to a greatly reduced extent only and which consequently lends itself to a simple efficient and readily surveyeable combination of a number of cryotrons and an associated network to form a compact cryotron arrangement.

In a cryotron in accordance with the invention the gate conductor and the control conductor are superimposed on a support as conductor strips shaped in the form of thin layers, one conductor strip being situated at one side only of the plane of the other conductor strip, while owing to the zigzag shape of at least one of the conductor strips, in normal projection onto the support, one conductor strip intersects the other at least twice. In a suitable embodiment of a cryotron according to the invention, the gate conductor is a rectilinear strip while the control conductor, which is shaped in the form of a zigzag tape, extends in the direction of length of the gate conductor, for example, substantially symmetrically with respect to the axis of the gate conductor. Alternatively, in a cryotron in accordance with the invention both the gate conductor and the control conductor may be shaped in the form of zigzag conductor strips or the gate conductor may have the form of a zigzag strip while the control conductor is designed as a rectilinear conductor strip which crosses the gate conductor several times. Furthermore, in accordance with the structural principle of the invention simple cryotrons may be made in which at least one gate conductor is combined with at least one control-conductor. Thus, in a cryotron a gate conductor may be combined with a number of control conductors by designing the gate conductor as a substantially rectilinear conductor strip, provision being made in the above-described manner of a number of control conductors succeeding one another along the gate conductor.

According to a further aspect of the invention, in a cryotron in accordance with the invention, the control conductor, at least the part thereof which in normal projection onto the support coincides with the gate conductor, preferably has a smaller circumference of the sectional area, more particularly, with substantially the same layer thicknesses of the gate conductor strip and control conductor strip, a smaller width than the gate conductor. Preferably the ratio of the said circumference or width of the gate conductor to the circumference or width of the control conductor is at least two to one.

The cryotrons in accordance with the invention are particularly suited for use in a cryotron arrangement comprising a number of cryotrons, in which on a common support the gate conductors and the control conductors in adjacent layers are connected in printed networks which may be deposited from vapour. More particularly, in a cryotron arrangement comprising a number of cryotrons in accordance with the invention, a number of gate conductors and control conductors of a number of cryotrons, which conductors are applied onto a common support as a number of superimposed layers separated from one another by thin electrically insulating layers only, are connected in a network, the gate conductors and control conductors, which in one layer are connected in an associated network, having complementary control conductors and gate conductors respectively in an adjacent layer which are connected in another associated network. The control conductors in one layer produce, through the thin insulating layer, a magnetic field in the gate conductors of the other layer, so that the two layers are intercoupled and the desired switching function of the assembly is ensured. Alternatively a plurality of layers provided on one support may be intercoupled in this manner. Thus, an entire cryotron arrangement can be provided in a number of flat planes on a support with a minimum of electrical connections between the layers so as to permit the use of techniques such as etching, printing, deposition from vapour and the like.

In order that the invention may readily be carried out, embodiments thereof will now be described more fully with reference to the accompanying diagrammatic drawings, in which:

FIGS. 1*a* and 1*b* show diagrammatically an embodiment of a cryotron in accordance with the invention, FIG. 1*a* is a plan view of the cryotron, while FIG. 1*b* is an associated sectional view taken along the axis of the gate conductor of FIG. 1*a*.

Figures 2, 3, 4, 5A, 5B:
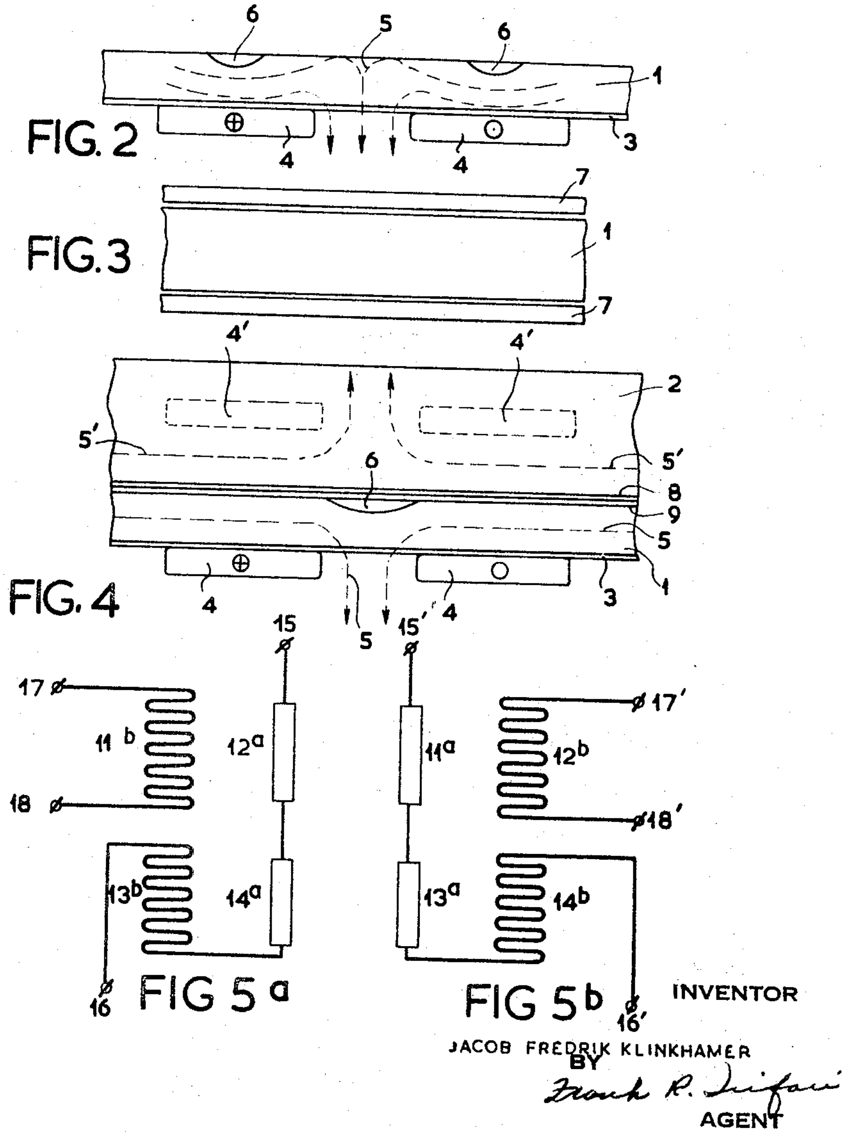
FIG. 2 shows a part of the sectional view of the cryotron of FIG. 1*b* on an enlarged scale.
FIG. 3 is a plan view of a special cryotron in accordance with the invention having compensation conducting strips arranged parallel to the gate conductor, the control conductor and the electrically insulating layer being omitted for the sake of clarity.

FIG. 4 is a diagrammatic cross-sectional view of another embodiment of a cryotron in accordance with the invention, while FIGS. 5*a* and 5*b* illustrate the efficient simple construction of a cryotron in accordance with the invention as used with a cryotron arrangement in accordance with the invention, in which a number of cryotrons are provided on a support in two parallel planes together with an associated network.

Figure 1A:
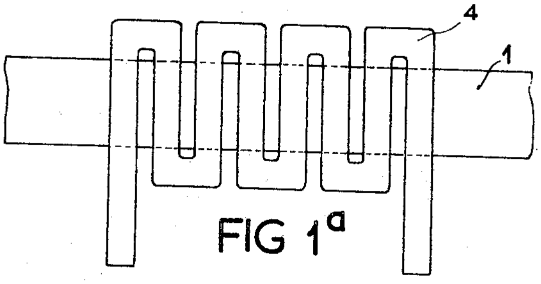
Figure 1B:
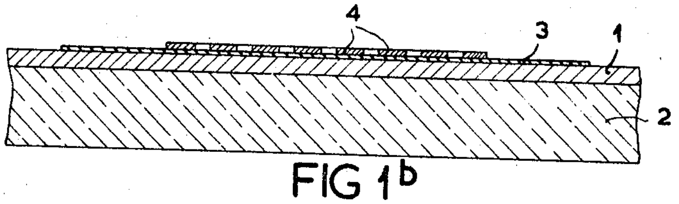

In the embodiment of a cryotron in accordance with the invention shown in FIGS. 1*a* and 1*b*, the gate conductor is arranged as a rectilinear conductor strip 1 made, for example, of tantalum, on a support 2 (FIG. 1*b*) which is not shown in FIG. 1*a* for the sake of clarity. A control conductor 4 shaped in the form of a zigzag tape, which in a normal projection onto the support 2 intersects the gate conductor strip 1 eight times, is superposed on the gate conductor strip 1 with the interposition of a thin electrically insulating layer 3, which for the sake of clarity is shown in FIG. 1*b* only. The control conductor 4, which may be made of niobium, is situated entirely on one side of the plane of the gate conductor 1. The rectangular shape of the zigzag tape shown in the figure is not an essential feature of the invention. When current is passed through the control conductor 4, a magnetic field is produced by this control conductor in the gate conductor, which field is particularly concentrated in the gaps between the two successive parts of the zigzag control conductors, as will be seen from FIG. 2, which again is a partial cross-sectional view of FIG. 1*b* shown diagrammatically on an enlarged scale. In this figure, a number of flux lines produced in the gate conductor 1 by current passing through the control conductors are shown by broken lines 5. These flux lines 5 are particularly concentrated between the successive branches of the zigzag tape, since the current passes through two successive branches of the zigzag tape in opposite directions, the resulting magnetic fields act in support of one another in the gaps. Thus, with a sufficiently large current strength, the control conductor produces in the gate conductor, especially in the parts of the gate conductor situated behind these gaps, parts of normal conductivity, while in the shade of the two branches of the zigzag tape, superconductive areas 6 (FIG. 2) may be left. Between the ends of the gate conductor a normal resistance is measured, if at least locally, for example, in the shade of the gaps, the gate conductor is normally conductive throughout its cross-sectional area owing to the magnetic field of the control conductors. In order to accomplish the state of normal conductivity in the gate conductor the current strength in the control conductor must therefore at least be such that this state is produced in the gate conductor. If it is desired to utilize especially the concentration of the magnetic field in the gate conductor parts situated behind the gaps, the width of the gaps, that is to say, the spacings between successive crossing parts of the zigzag tape, is kept small, preferably smaller than the width of the control conductor, more particularly smaller than one half of the width of the control conductor.

In the cryotron shown in FIG. 1, the gate conductor and the control conductor have substantially the same layer thickness but the width of the control conductor is smaller than, specifically less than half, the width of the gate conductor. Thus it can be ensured that with a certain current strength in the control conductor the gate conductor can be caused to assume the normal-conductivity state by the magnetic field produced by this current while with a current of the same strength flowing through the gate conductor the self-induced magnetic field of the gate conductor is too small to cause the gate conductor to assume the state of normal conductivity. This property of such a cryotron is of particular advantage for use in composite cryotron arrangements in which the gate conductor of one cryotron is connected in series with at least one control conductor of at least one other cryotron. If the cryotron in accordance with the invention is to be used as a memory element, this proportioning is advantageous but not necessary. In the super-conductivity state, in which the control conductor generally is, owing to the fact that usually its transition temperature exceeds that of the gate conductor, the current in a current conductor concentrates at the periphery due to the skin effect. If, now, the ratio between the circumference of the sectional area of the gate conductor and the circumference of the sectional area of the control conductor, more particularly with substantially equal layer thicknesses the ratio between the widths of these conductors is $x:1$, where $x$ may be any number, in a first approximation with negligible thickness of the insulation between the two conductors, the ratio of the mean magnetic field strength in the gate conductor which is produced by the self-induced magnetic field of the gate conductor at a certain strength of the current flowing through the gate conductor, to the mean magnetic field strength in the gate conductor produced by the magnetic field of the control conductor with the same strength of the current flowing through the control conductor, is substantially equal to $1:x$. If, therefore, the width of the gate conductor is materially greater than that of the control conductor, with a sufficiently large current flowing through the control conductor the resulting magnetic field can bring the gate conductor into a normal-conductivity state, whereas the same current strength in the gate conductor produces a magnetic field therein which is too small to cause the gate conductor to pass to the normal-conductivity state.

The gate conductor may consist of tantalum, while its layer thickness and width may be about 1 micron and about 1 mm., respectively. The control conductor may consist of niobium and have the same layer thickness as the gate conductor but a width of about 0.3 mm.

Owing to the skin effect the current in the gate conductor strip may concentrate in the sharp edges of this strip and there produce a magnetic field which is stronger than the mean magnetic field along the circumference. Hence, when the gate conductor is in the super-conductivity state, its edges may become normally conductive. If required, according to a further feature of the invention, these inconvenient effects can be avoided by the provision of compensation conductor strips arranged in the plane of the gate conductor on both sides thereof and parallel thereto. In a cryotron arrangement in accordance with the invention a constant direct current is passed through these compensation conductor strips in the same direction as the current flowing through the gate conductor, the value of this current in the compensation conductor strips being sufficient to effect the desired field compensation by its magnetic counterfield. FIG. 3 shows diagrammatically a plan view of a gate conductor 1 and compensation conductor strips 7 arranged parallel thereto. Obviously, for obtaining compensation it is not required but desirable for these compensation strips to be made of a super-conductive material.

As has already been mentioned with reference to FIG. 2, due to the concentration of the magnetic field of the control conductor in the gate conductor parts situated behind the gaps, the normally conductive parts of the gate conductor may be asymmetrically distributed over its cross-sectional area and its length. According to the invention, if desired this asymmetry can be largely eliminated by the provision, at the other side of the plane of the gate conductor, of a super-conductive surface which is separated from the gate conductor by a thin electrically insulating layer only and favorably influences the magnetic field distribution in the gate conductor. FIG. 4 is a diagrammatic cross-sectional view of such a cryotron in accordance with the invention. This figure is only distinguished from FIG. 2 in that at the upper side of the gate conductor 1 there is provided on the support 2 a super conductive surface 8 which is separated from the gate conductor 1 by a thin electrically insulating layer 9. As is well known in the magnetic field theory, the provision of a conductive surface can modify the magnetic field distribution, as if identical current conductors were provided symmetrically with respect to this surface on the other side thereof also but which pass a current in the opposite direction. The virtual conductors with the associated virtual flux lines are shown in FIGURE 4 by the broken lines 4' and 5', respectively. As is indicated in the figure, the field distribution can be modified so by the provision of the super-conductive surface that the normal-conductivity regions are distributed more symmetrically about the sectional area and the length of the gate conductor, while in the shade of the gaps small normal-conductivity regions 6 may now be left.

For manufacturing a cryotron in accordance with the invention a large variety of known techniques can be used such as deposition from vapour, electrolytic deposition, chemical imprinting and the like. Furthermore it will be appreciated that within the scope of the invention there may be numerous further variations both in the shape of the conductor strips and in their manufacture.

An example of the simple structure of a cryotron arrangement in accordance with the invention will now be described more fully with reference to FIGURE 5, from which the efficient particularly suitable structure of such a cryotron will be apparent.

The arrangement, which may form part of a logical circuit, comprises two parallel surfaces separated from one another by a thin electrically insulating layer. The networks printed in these two surfaces are shown separately in FIGURE 5, in which FIGURE *5a* is a plan view of the surface provided immediately on the support and FIGURE *5b* is a plan view of the superposed surface. The reference numerals 11 to 14 denote the cryotrons used in the arrangement, the index *a* denoting the gate conductor and the index *b* the control conductor of the cryotron associated with the numeral. The surfaces *5a* and *5b* are superimposed so that the associated gate conductor and the control conductor of each cryotron are superposed on one another. Between terminals 15 and 16 and 15' and 16' an E.M.F. is applied which, if the gates **12*a*, 14*a* and 11*a*, 13*a* included in these circuits are superconductive, supplies a current of a strength sufficient for the gate conductors 13*a* and 14*a* to be made normally conductive by means of the control conductors 13*b* and 14*b*, respectively, while the E.M.F., if one of the gates in these circuits is normally conductive, supplies insufficient current to the control conductor included in this circuit for the associated gate to be made normally conductive. Suppose a current pulse is applied between terminals 17 and 18, which through the control conductor 11*b* renders the gate 11*a* normally conductive. At this time the gate conductor 14*a* is super-conductive as is the gate conductor 12*a*, as long as the control conductor 12*b* passes insufficient current. In this event, the current flowing through 13*b* is sufficient to render the gate conductor 13*a* normally conductive. Hence after the application of the current pulse through terminals 17–18 the branch 15–16 is super-conductive and the branch 15'–16' normally conductive. If, now, a current pulse is applied to terminals 17'–18' which sufficiently energizes the control conductor 12*b*, the conductivity state of the system is reversed. Since the gate conductor 12*a* becomes normally conductive, the gate conductor 13*a* becomes super-conductive with the result that the control conductor 14*b* renders the gate conductor 14*a* normally conductive. The branch 15–16 is kept normally conductive and the branch 15'–16' super-conductive even on termination of the current pulse. The initial condition can be restored by again applying a sufficiently large current pulse to the terminals 17, 18. Finally it should be mentioned that the gate conductors 12*a*, 14*a* and the gate conductors 11*a*, 13*a*** can be combined in pairs to form one elongated conductor strip.

What is claimed is:

1. A cryotron comprising a support and on the support a gate conductor comprising a thin, strip-like layer of superconductive material and a control conductor comprising a thin, strip-like layer for magnetically controlling the superconductivity of said gate conductor, said gate and control conductors being in superposed relationship and one of them being folded and crossing the other at least twice, and plural compensation conductor strips adjacent and on opposite sides of and extending parallel to the gate conductor to provide magnetic compensation for the reduction of normal conductivity residually present within predetermined portions of said gate conductor whenever the latter is in a superconductive state.

2. A cryotron comprising a support and on the support a surface of superconductive material, a thin electrically insulating layer, a gate conductor comprising a thin, strip-like layer of superconductive material and a control conductor comprising a thin, strip-like layer for magnetically controlling the superconductivity of said gate conductor, said gate and control conductors being in superposed relationship and one of them being folded and crossing the other at least twice, the superconductive surface being located adjacent the side of the gate conductor opposite to that adjacent the control conductor.

3. A cryotron arrangement comprising a support and on the support in a first plane a first gate conductor comprising a thin, strip-like layer of superconductive material connected to a second control conductor comprising a thin, strip-like layer, a second gate conductor comprising a thin strip-like layer of superconductive material connected to a first control conductor comprising a thin, strip-like layer both located in a second plane adjacent the first, said first gate and control conductors, and said second gate and control conductors, being in superposed insulating relationship and one each of said first and second conductors being folded and crossing the other at least twice, said first control conductor being adapted for magnetic control of the superconductivity of said first gate conductor, and said second control conductor being adapted for magnetic control of the superconductivity of said second control conductor.

4. A cryotron arrangement as claimed in claim 3 wherein the gate conductors are generally rectilinear, and the control conductors have a zigzag shape crossing back and forth over the length of the respective gate conductors.

5. A cryotron comprising a support and on the support a gate conductor comprising a thin, strip-like layer of superconductive material adapted to conduct current in at least one predetermined direction and a control conductor comprising a thin, strip-like layer for magnetically controlling the superconductivity of said gate conductor, said gate and control conductors being in superposed relationship and one of them being folded and crossing the other at least twice, and plural compensation conductor strips disposed adjacent and on opposite sides of and extending parallel to the gate conductor, said compensation strips being adapted to conduct a substantially constant current in the same direction as the current direction of said gate conductor to provide magnetic compensation in order to reduce the normal conductivity residually present within predetermined portions of said gate conductor whenever the latter is in a superconductive state.

6. A superconductor device comprising a support and on the support a generally rectilinear gate conductor comprising a thin, strip-like layer of superconductive material and a control conductor comprising a thin, strip-like layer for magnetically controlling the superconductivity of said gate conductor, said gate and control conductors being in superposed relationship, said control conductor being folded into a zigzag shape crossing over the length of said gate conductor at least twice and wherein the spacing between the edges of the folded control conductor is less than its width.

7. An electrical circuit device comprising an insulating support having a planar surface, a layer of superconductive material on said support, at least one superconductive gate of generally rectangular cross section disposed close to and insulated from said layer, and a control conductor disposed on the same side of said layer as said gate so as to sandwich asid gate between said layer and said control conductor, and adapted to apply a controlling magnetic field to said gate to cause transition of said gate between superconducting and finite resistance state, said gate being adapted to conduct a current and induce a self field around the gate, and said layer modifying the field around said gate, thereby to increase its current carrying capacity.

8. A superconductor device comprising a support, a layer of superconductive material thereon, a thin electrically insulating layer over said superconductive layer, a generally rectilinear gate conductor comprising a thin, strip-like layer of superconductive material disposed adjacent said insulating layer, a control conductor comprising a thin, strip-like layer for magnetically controlling the superconductivity of said gate conductor and having a width less than one half the width of said gate conductor, said gate and control conductors being in insulated superposed relationship and one of them being folded and crossing the other at least twice, said control conductor being located adjacent the side of the gate conductor opposite that adjacent the layer of superconductive material.

9. A superconductor device comprising a support, a gate conductor comprising a thin, strip-like layer of superconductive material on said support, a control conductor for magnetically controlling the superconductivity of said conductor comprising a thin strip-like layer disposed close to and insulated from said gate conductor, said control conductor having a width less than one half the width of said gate conductor, said gate and control conductors being in superposed relationship and one of them being folded and crossing the other at least twice, and first and second magnetic compensation conductor strips adjacent to and on opposite sides of and extending parallel to the edges of the gate conductor.

10. A superconductor device comprising a support, a layer of superconductive material thereon, a thin electrically insulating layer over said superconductive layer, a generally rectilinear gate conductor comprising a thin, strip-like layer of superconductive material disposed adjacent said insulating layer, a control conductor comprising a thin, strip-like layer for magnetically controlling the superconductivity of said gate conductor, said gate and control conductors being in insulated superposed relationship, said control conductor being folded into a zigzag shape crossing over the length of said gate conductor at least twice and wherein the spacing between the edges of successive cross-over portions of said folded control conductor is less than the width of said control conductor.

11 An electrical circuit element comprising an elongate first superconductive body adapted to be connected in an electrical circuit, current carrying inductive means comprising a thin strip-like layer folded to cross over said elongate body at least twice for applying a magnetic field to the first body, and a second superconductive body having a substantial surface area facing and disposed closely adjacent and insulated from the first said body to modify a magnetic field about the first body.

12. A superconductive device comprising a superconductive gate conductor adapted to be connected in an electrical circuit, a current carrying control conductor disposed adjacent to and on one side of said gate conductor for applying a magnetic field thereto, and a superconductive body disposed on the opposite side of and adjacent to said gate conductor, said superconductive body having a substantial surface area facing said gate conductor thereby to modify the magnetic field about said gate conductor substantially.

13. Apparatus as described in claim 12 further comprising a first layer of insulative material positioned between said gate conductor and said superconductive body and a second insulative layer disposed between said gate conductor and said control conductor.

14. A superconductive device comprising an insulating support having a planar surface, a layer of superconductive material on said support, a strip-like superconductive path disposed close to and insulated from said layer, said path being adapted to conduct a current and induce a self field around the path, and a control conductor comprising a thin strip-like layer of superconductor material folded into a zigzag shape to cross over said path at least twice in the length direction and disposed on the same side of said layer as said path for applying a controlling magnetic field to said path thereby to vary the conductivity of said path, said layer modifying the field around said path thereby to increase its current carrying capacity.

15. A superconductive device comprising an elongated superconductive gate conductor element adapted to conduct current through a portion thereof and thereby induce a magnetic field about itself, a superconductive body having a substantial surface area facing and disposed closely adjacent said conductor element, said surface area being at least coextensive with a portion of said conductor element thereby to modify the field around said element, the superconductive body being isolated from any electric current source, and a superconductive control conductor for applying a magnetic control field to said gate conductor element and disposed adjacent thereto so as to sandwich said gate conductor element between said superconductive body and said control conductor.

References Cited

UNITED STATES PATENTS

| | | | |
|---|---|---|---|
| 2,474,988 | 7/1949 | Sargrove | 250—16.9 |
| 2,989,714 | 6/1961 | Park et al. | 307—88.5 |
| 3,015,041 | 12/1961 | Young | 307—88.5 |
| 3,100,267 | 8/1963 | Crowe | 307—88.5 |

OTHER REFERENCES

National Electronics Conference, October 1957, vol. XIII, pp. 574–582, "A Review of Superconductive Switching Circuits," Slade et al.

ARTHUR GAUSS, *Primary Examiner.*

GEORGE WESTBY, ROY LAKE, *Examiners.*

J. BUSCH, *Assistant Examiner.*